(12) United States Patent
Yamamoto et al.

(10) Patent No.: US 8,963,820 B2
(45) Date of Patent: Feb. 24, 2015

(54) SEMICONDUCTOR DEVICE, LIQUID CRYSTAL DISPLAY AND ELECTRONIC APPARATUS

(71) Applicant: Rohm Co., Ltd., Kyoto (JP)

(72) Inventors: Takateru Yamamoto, Kyoto (JP); Dai Onimatsu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 51 days.

(21) Appl. No.: 13/934,434

(22) Filed: Jul. 3, 2013

(65) Prior Publication Data
US 2014/0009374 A1    Jan. 9, 2014

(30) Foreign Application Priority Data

Jul. 6, 2012   (JP) .................................. 2012-152545

(51) Int. Cl.
*G09G 3/36* (2006.01)
*H03K 5/08* (2006.01)
*H03K 3/0231* (2006.01)

(52) U.S. Cl.
CPC ............ *H03K 5/084* (2013.01); *H03K 3/02315* (2013.01)
USPC ........ 345/89; 345/99; 345/100; 257/E21.214; 257/E21.531

(58) Field of Classification Search
CPC .. G09G 3/3648; G09G 3/2011; G09G 3/3688
USPC ............. 345/87–100; 257/E21.001, E21.214, 257/E21.531, 208
See application file for complete search history.

(56) References Cited

U.S. PATENT DOCUMENTS

| | | | | |
|---|---|---|---|---|
| 2007/0272949 | A1* | 11/2007 | Shinomiya et al. | 257/208 |
| 2008/0056044 | A1* | 3/2008 | Tomita | 365/222 |
| 2008/0129371 | A1* | 6/2008 | Hartmann et al. | 327/513 |
| 2010/0117192 | A1* | 5/2010 | Lee et al. | 257/532 |
| 2011/0042750 | A1* | 2/2011 | Chuang et al. | 257/368 |
| 2011/0065216 | A1* | 3/2011 | Kaji et al. | 438/16 |
| 2012/0028376 | A1* | 2/2012 | Radwan et al. | 438/5 |
| 2012/0064645 | A1* | 3/2012 | Lee et al. | 438/17 |
| 2012/0122248 | A1* | 5/2012 | Hirayu | 438/6 |

FOREIGN PATENT DOCUMENTS

| | | |
|---|---|---|
| JP | 2005-063147 | 3/2005 |
| JP | 2008-140960 | 6/2008 |

* cited by examiner

*Primary Examiner* — Kimnhung Nguyen
(74) *Attorney, Agent, or Firm* — Fish & Richardson P.C.

(57) ABSTRACT

A semiconductor device includes: a trimming object circuit configured to use a trimming circuit to adjust an output based on a trimming value; and a trimming value setting circuit configured to set the trimming value. The trimming value setting circuit includes: a register configured to volatilely store a pseudo-trimming value set with reference to a trimming table such that an output value of the trimming object circuit becomes equal to a target value; a trimming value storage configured to non-volatilely store a final trimming value, wherein the final trimming value is set by correcting the pseudo-trimming value with reference to a trimming value correction table such that the output value of the trimming object circuit, which is obtained based on the pseudo-trimming value, becomes equal to the target value; and a selector configured to select one of the pseudo-trimming value and the final trimming value as the trimming value.

20 Claims, 19 Drawing Sheets

FIG. 4

| TBL1 | | TBL2 | |
|---|---|---|---|
| ERR1 | S11 | ERR2 | S11a |
| ⋮ | ⋮ | | |
| +30 | 30down | | |
| +29 | 29down | | |
| +28 | 28down | ⋮ | ⋮ |
| ⋮ | ⋮ | +3 | 3down |
| +3 | 3down | +2 | 2down |
| +2 | 2down | +1 | 1down |
| +1 | 1down | 0 | 0 |
| 0 | 0 | −1 | 1up |
| −1 | 1up | −2 | 2up |
| −2 | 2up | −3 | 3up |
| −3 | 3up | ⋮ | ⋮ |
| ⋮ | ⋮ | | |
| −28 | 28up | | |
| −29 | 29up | | |
| −30 | 30up | | |
| ⋮ | ⋮ | | |

TBL1: M bit
TBL2: N bit

SEMICONDUCTOR DEVICE, LIQUID CRYSTAL DISPLAY AND ELECTRONIC APPARATUS

CROSS-REFERENCE TO RELATED APPLICATION

This application is based upon and claims the benefit of priority from Japan Patent Application No. 2012-152545, filed on Jul. 6, 2012, the entire contents of which are incorporated herein by reference.

TECHNICAL FIELD

The present disclosure relates to a semiconductor device equipped with a trimming circuit, and a liquid crystal display and an electronic apparatus using the same.

BACKGROUND

As higher definition and performance are demanded, modern mobile phones such as smart phones require a very high precision for providing output values (for example, a clock frequency, a grayscale voltage, etc.) of various circuits built in a display panel driver IC (Integrated Circuit). To this end, a trimming method has been conventionally used to achieve a high precision of the output values in a shipment test.

In more detail, the conventional trimming method performs the operations of (1) measuring a trimming-before output value for a trimming object circuit, (2) calculating a trimming value based on a result of the measurement with reference to a prepared unique trimming table, and (3) carrying out an actual trimming process, and (4) measuring a trimming-after output value.

FIG. 17 is a view showing an ideal trimming result. If a trimming circuit assembled into a trimming object circuit has no manufacture tolerance (manufacture tolerance of capacitors, resistors, switches and so on forming the trimming circuit), the earlier-described conventional trimming method can be used to adjust a trimming-after output value to a target value.

However, in some cases, the trimming-after value is deviated from the target value due to the manufacture tolerance of the trimming circuit.

FIG. 18 is a view showing a non-uniform trimming-after output value due to a manufacture tolerance of a trimming circuit. As shown in FIG. 18, even if a trimming-before output value is trimmed for the same sample using the same trimming value, a trimming-after output value may be varied if a trimming circuit has a manufacture tolerance.

The conventional trimming method does not consider the manufacture tolerance of the trimming circuit and accepts it as a margin of error even if the trimming-after output value is non-uniform. However, the manufacture tolerance of the trimming circuit cannot be ignored in order to realize the required high trimming precision.

SUMMARY

The present disclosure provides some embodiments of a semiconductor device which is capable of achieving improved trimming precision, and a liquid crystal display and an electronic apparatus using the same.

According to one embodiment of the present disclosure, there is provided a semiconductor device including: a trimming object circuit configured to use a trimming circuit to adjust an output based on a trimming value; and a trimming value setting circuit configured to set the trimming value, the trimming value setting circuit including: a register configured to volatilely store a pseudo-trimming value set with reference to a trimming table such that an output value of the trimming object circuit becomes equal to a target value; a trimming value storage configured to non-volatilely store a final trimming value with a predetermined trimming process, wherein the final trimming value is set by correcting the pseudo-trimming value with reference to a trimming value correction table such that the output value of the trimming object circuit, which is obtained based on the pseudo-trimming value, becomes equal to the target value; and a selector configured to select one of the pseudo-trimming value and the final trimming value as the trimming value. (Configuration 1)

According to another embodiment of the present disclosure, there is provided a semiconductor device including: a trimming object circuit configured to use a trimming circuit to adjust an output based on a trimming value; and a trimming value setting circuit configured to set the trimming value, the trimming value setting circuit including: a register configured to volatilely store an initial trimming value; a trimming value storage configured to non-volatilely store a correction-before trimming value with a predetermined trimming process, wherein the correction-before trimming value is set with reference to a trimming table such that an output value of the trimming object circuit, which is obtained based on the initial trimming value, becomes equal to a target value; a selector configured to select one of the initial trimming value and the correction-before trimming value; and a trimming value correcting part configured to correct the correction-before trimming value with reference to a trimming value correction table such that the output value of the trimming object circuit, which is obtained based on the correction-before trimming value, becomes equal to the target value, and output the corrected trimming value as the trimming value. (Configuration 2)

According to another embodiment of the present disclosure, there is provided a semiconductor device including: a trimming object circuit configured to use a trimming circuit to adjust an output based on a trimming value; and a trimming value setting circuit configured to set the trimming value, the trimming value setting circuit including: a register configured to volatilely store a pseudo-trimming value set with reference to a trimming table such that an output value of the trimming object circuit becomes equal to a target value; a trimming value storage configured to non-volatilely store a final trimming value with a predetermined trimming process; a selector configured to select one of the pseudo-trimming value and the final trimming value; and a trimming value correcting part configured to correct the pseudo-trimming value with reference to a trimming value correction table such that the output value of the trimming object circuit, which is obtained based on the pseudo-trimming value, becomes equal to the target value, and set the final trimming value. (Configuration 3)

In the semiconductor device of Configuration 2 or 3, the trimming value correcting part switches between a turn-on and a turn-off state based on an output of the trimming value storage. (Configuration 4)

In the semiconductor device of any one of Configurations 1 to 4, the selector switches a signal path based on an output of the trimming value storage. (Configuration 5)

In the semiconductor device of any one of Configurations 1 to 5, a bit width of the trimming value correction table is smaller than a bit width of the trimming table. (Configuration 6)

In the semiconductor device of any one of Configurations 1 to 6, the trimming process is one selected from a group consisting of a Zener-zap trimming process, a polysilicon fuse trimming process, a laser cut trimming process and an OTPROM (One Time Programmable Read Only Memory) trimming process. (Configuration 7)

In the semiconductor device of any one of Configurations 1 to 7, the semiconductor device further includes: a logic part configured to latch and output a digital signal in synchronization with a clock signal; an oscillator configured to generate the clock signal; a shift register configured to level-shift the digital signal; a grayscale voltage generator configured to generate a plurality of grayscale voltages from a reference voltage; a digital/analog converter (DAC) configured to use the grayscale voltages to generate an analog signal from the digital signal; and an amplifier configured to amplify the analog signal to generate an output signal to liquid crystal pixels forming a liquid crystal display panel, wherein either the oscillator or the grayscale voltage generator corresponds to the trimming object circuit. (Configuration 8)

According to another embodiment of the present disclosure, there is provided a liquid crystal display including: a liquid crystal display panel including liquid crystal pixels; and a semiconductor device of claim 8, which is configured to generate an output signal to the liquid crystal pixels. (Configuration 9)

According to another embodiment of the present disclosure, there is provided an electronic apparatus including a liquid crystal display of Configuration 9. (Configuration 10)

In the electronic apparatus of Configuration 10, the electronic apparatus is one selected from a group consisting of a television, a mobile phone and an information terminal (Configuration 11)

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a view showing one example of a trimming table and a trimming value correction table.

DETAILED DESCRIPTION

Reference will now be made in detail to various embodiments, examples of which are illustrated in the accompanying drawings. In the following detailed description, numerous specific details are set forth in order to provide a thorough understanding of the inventive aspects of this disclosure. However, it will be apparent to one of ordinary skill in the art that the inventive aspect of this disclosure may be practiced without these specific details. In other instances, well-known methods, procedures, systems, and components have not been described in detail so as not to unnecessarily obscure aspects of the various embodiments.

<Liquid Crystal Display>

Figure 1:
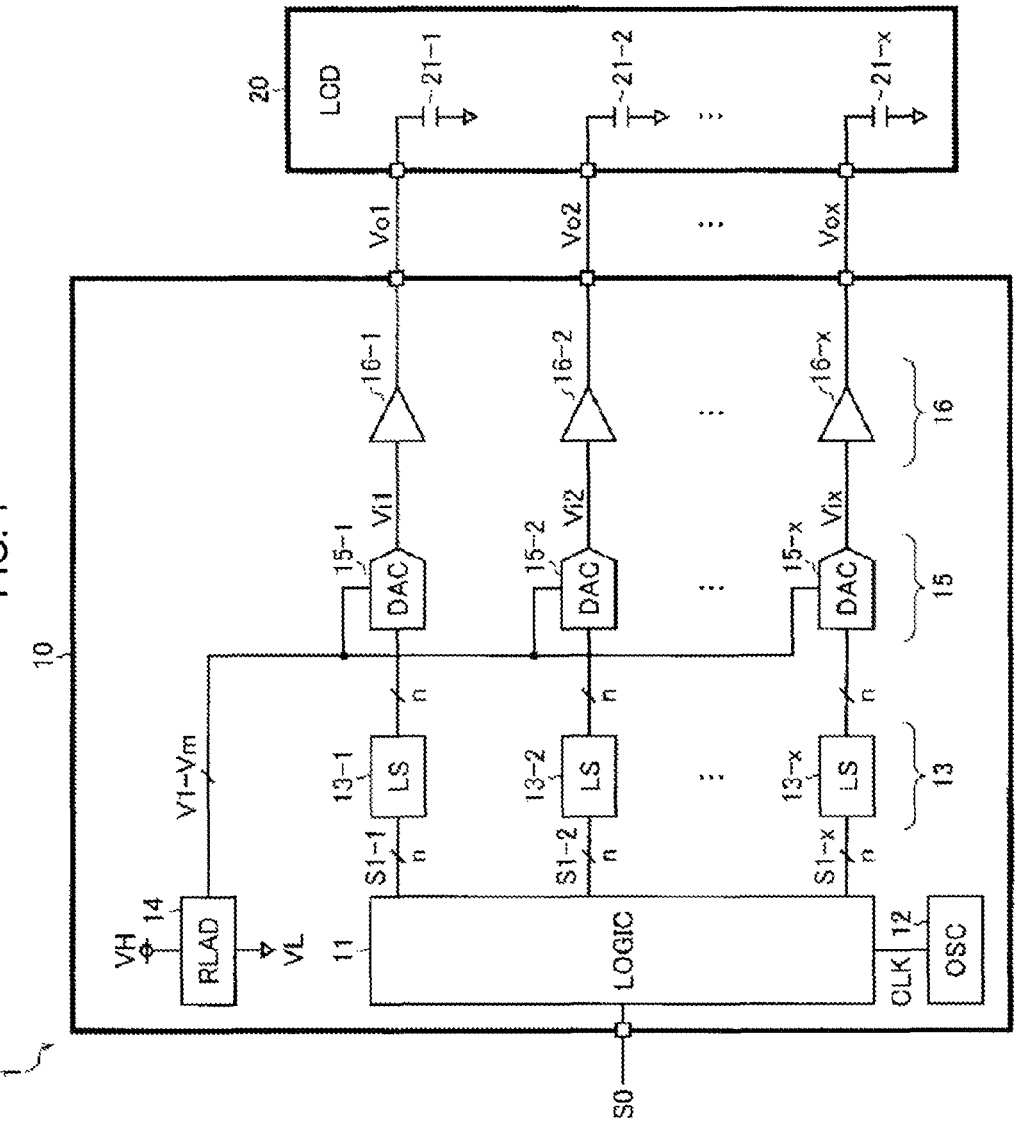
FIG. 1 is a block diagram showing one example configuration of a liquid crystal display.

FIG. 1 is a block diagram showing one example configuration of a liquid crystal display. In this example configuration, a liquid crystal display 1 includes a liquid crystal driver 10 and a liquid crystal display panel (LCD) 20.

The liquid crystal driver 10 may be implemented with a monolithic semiconductor IC (or an LCD (Liquid Crystal Display) driver IC) for driving the liquid crystal display panel 20 based on a video signal S0 input from a video source (not shown) and includes a logic part (LOGIC) 11, an oscillator (OSC) 12, a level shifter (LS) 13, a grayscale voltage generator (RLAD) 14, a digital-analog converter (DAC) 15 and a source amplifier 16.

The logic part 11 includes an interface for exchanging signals with the external of the liquid crystal driver 10 (for example, a MIPI (Mobile Industry Processor Interface) alliance-based DSI (Display Serial Interface)) and serves as a digital signal processing device for latching and outputting the external input video signal S0 to the level shifter 13, as a n-bit parallel data signal S1. In addition, the logic part 11 operates in synchronization with a system lock signal CLK supplied from the oscillator 12.

The oscillator 12 generates the system lock signal CLK at a certain frequency and supplies it to the logic part 11.

The level shifter 13 shifts the data signal S1, latched and output from the logic part 11, to a signal level suitable for input to the DAC 15.

The grayscale voltage generator 14 generates m ($=2^n$) discrete grayscale voltages V1 to Vm using a resistor ladder connected between an application terminal of an upper reference voltage VH and an application terminal of a lower reference voltage VL.

The DAC 15 uses the grayscale voltages V1 to Vm to generate an analog input voltage Vi from the digital data signal S1. In more detail, the DAC 15 selects one of the grayscale voltages V1 to Vm based on a digital value (0 to $2^{n-1}$ in decimal number notation) of the data signal S1 and outputs the selected one as the input voltage Vi.

The source amplifier 16 amplifies the input voltage Vi to generate an output voltage Vo to be applied to the liquid crystal display panel 20.

The liquid crystal display panel 20 is a video output means including a liquid crystal pixel 21 driven by the liquid crystal driver 10. The liquid crystal pixel 21 has a light transmittance varied depending on a value of the output voltage V0 applied from the liquid crystal driver 10.

For liquid crystal pixels 21-1 to 21-x of x columns forming the liquid crystal display panel 20, level shifters 13-1 to 13-x, DACs 15-1 to 15-x and source amplifiers 16-1 to 16-x are provided for the respective columns.

<Trimming Value Setting Circuit> (First Example Configuration)

Figure 2:
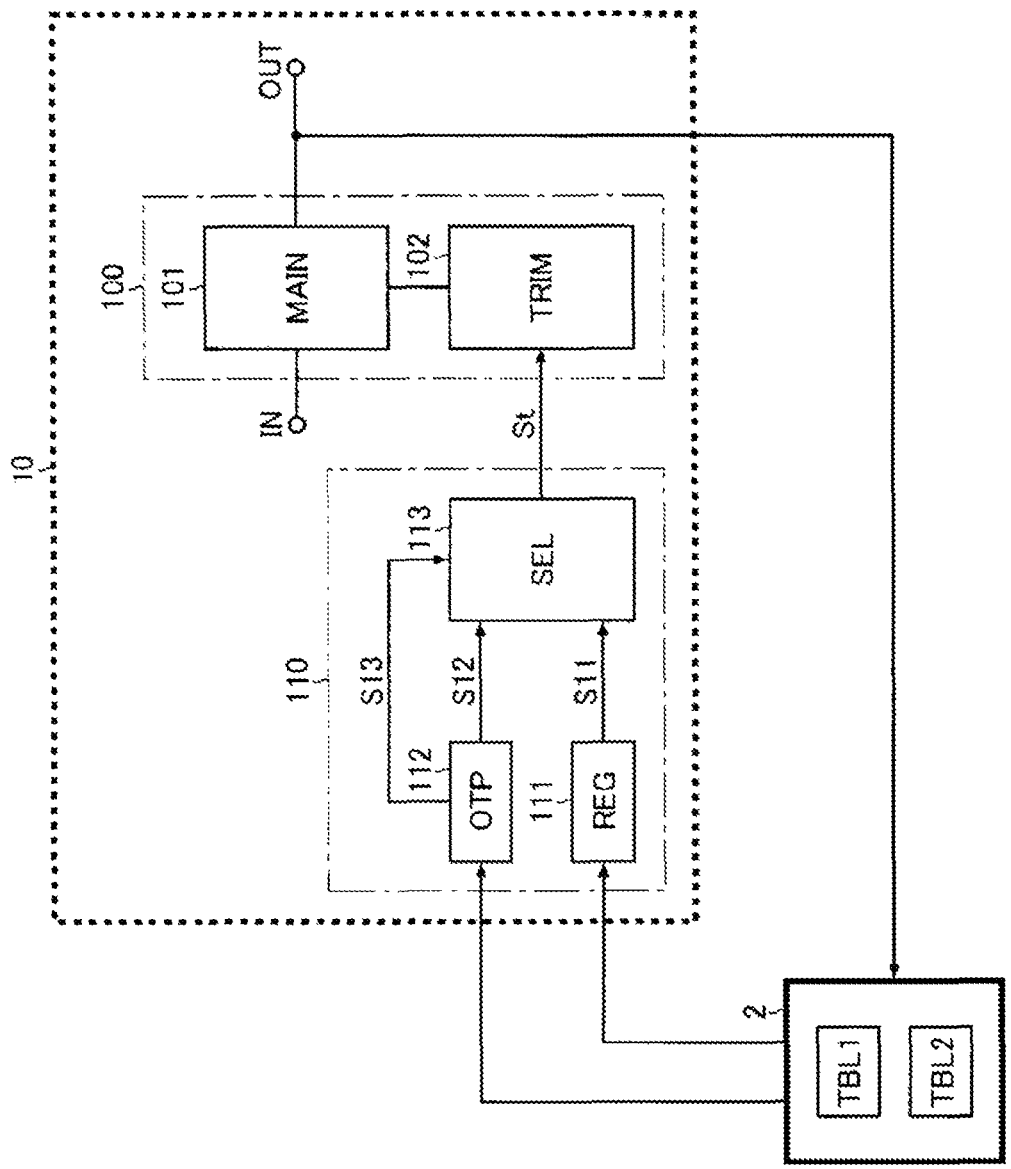
FIG. 2 is a block diagram showing a first example configuration of a trimming value setting circuit.

FIG. 2 is a block diagram showing a first example configuration of a trimming value setting circuit. The liquid crystal driver 10 shown in FIG. 2 includes a trimming object circuit 100 and a trimming value setting circuit 110 of the first example configuration.

The trimming object circuit 100 includes a main circuit (MAIN) 101 for generating an output value OUT from an input value IN, and a trimming circuit (TRIM) 102 for adjusting an output of the main circuit 101 based on a trimming value St.

In the liquid crystal driver 10, the trimming circuit 102 (including capacitors, resistors and switches) may have different bit widths, such as 4 bits, 5 bits, 6 bits, 7 bits, 14 bits and so on, depending on an output precision required for the trimming object circuit 100.

In addition, among the various circuit blocks shown in FIG. 1, either the oscillator 12 requiring a high precision of the system lock signal CLK or the grayscale voltage generator 14 supplied with a high precision of the grayscale voltages V1 to Vm (further the upper reference voltage VH and the lower reference voltage VL) may correspond to the trimming object circuit 100 requiring a very high output precision.

For example, if it is understood that the trimming object circuit 100 is the oscillator 12, the output value OUT of the main circuit 101 corresponds to an oscillation frequency of the system lock signal CLK. In addition, if it is understood that the trimming object circuit 100 is the grayscale voltage generator 14, the output value OUT of the main circuit 101 corresponds to a value of either the upper reference voltage VH or the lower reference voltage VL.

The trimming value setting circuit 110 of the first example configuration is a circuit block for setting the trimming value St and includes a register (REG) 111, an OTPROM (One-Time Programmable Read Only Memory, OTP) 112 and a selector (SEL) 113.

The register 111 stores a pseudo-trimming value S11 in a volatile manner. The pseudo-trimming value S11 is set with reference to a trimming table TBL1 such that the output value OUT of the trimming object circuit 100 is equal to a target value during a trimming process which will be described later. The trimming table TBL1 is implemented with software installed in a test device (tester) 2 placed outside the liquid crystal driver 10 and the setting of the pseudo-trimming value S11 is performed by the tester 2.

The OTPROM 112 is a trimming value storage for storing a final trimming value S12 in a non-volatile manner. The final trimming value S12 is set by correcting the pseudo-trimming value S11 with reference to a trimming value correction table TBL2 such that the output value OUT of the trimming object circuit 100, which is obtained based on the pseudo-trimming value S11, is equal to a target value during the trimming process which will be described later. Like the trimming table TBL1, the trimming value correction table TBL2 is implemented with software installed in the tester 2 and the setting of the final trimming value S12 (or the correction of the pseudo-trimming value S11) is also performed by the tester 2.

The selector 113 selects one of the pseudo-trimming value S11 and the final trimming value S12, as the trimming value St. The selector 113 switches a signal path based on a switching signal S13 read from the OTPROM 112. If the OTPROM 112 is unwritten, the switching signal S13 has a value (initial value) to instruct a signal path switching to the register 111, while the switching signal S13 read from the written OTPROM 112 has a value to instruct a signal path switching to the OTPROM 112. This configuration allows the signal path of the selector 113 to automatically switch from the register 111 to the OTPROM 112 after performing the trimming process (the writing of data into the OTPROM 112).

Figure 3:
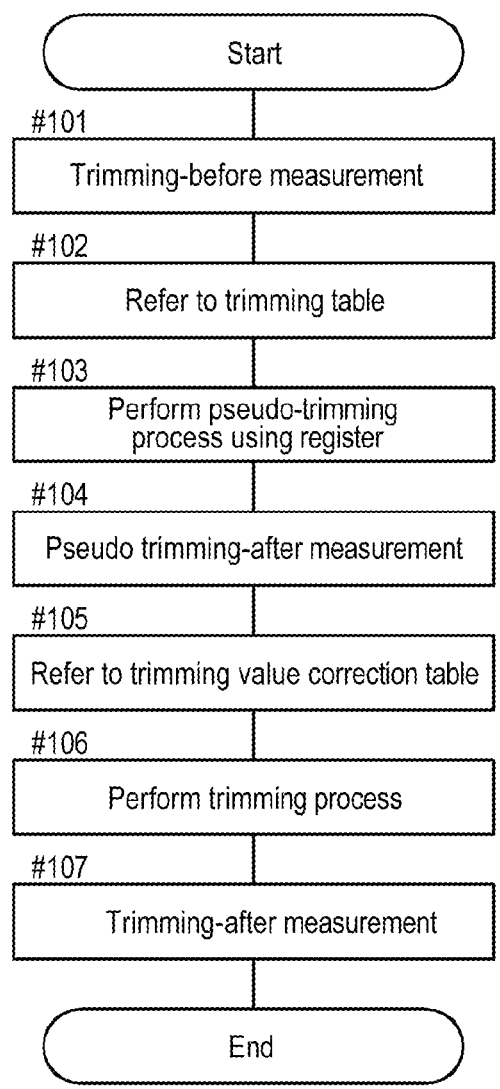
FIG. 3 is a flow chart showing a first trimming process.

FIG. 3 is a flow chart showing a first trimming process. The tester 2 is basically responsible for performance of this flow chart.

At start of the flow chart, trimming-before measurement of the output value OUT is first carried out at Step #101. In the trimming-before measurement, the trimming-before (i.e., unadjusted) output value OUT is measured and an error ERR1 between a target value and the output value OUT is determined.

Next, at Step #102, the pseudo-trimming value S11 is set with reference to the trimming table TBL1 such that the trimming-before output value OUT becomes equal to the target value. In the trimming table TBL1, as shown in the left side of FIG. 4, errors ERR1 between the target value and the output value OUT are uniquely associated with pseudo-trimming values S11. In addition, a bit width M of the trimming table TBL1 is designed to have a value (for example, 14 bits) to satisfy an output precision required for the trimming object circuit 100.

If the error ERR1 has a positive value (i.e., the trimming-before output value OUT is larger than the target value), the pseudo-trimming value S11 is set to lower the trimming-before output value OUT. For example, if the error ERR1 is +30 steps, the pseudo-trimming value S11 is set to a value (30 down) to lower the trimming-before output value OUT by 30 steps. On the contrary, if the error ERR1 has a negative value (i.e., the trimming-before output value OUT is smaller than the target value), the pseudo-trimming value S11 is set to raise the trimming-before output value OUT. For example, if the error ERR1 is −30 steps, the pseudo-trimming value S11 is set to a value (30 up) to raise the trimming-before output value OUT by 30 steps. If the error ERR1 has a zero value (i.e., the trimming-before output value OUT is equal to the target value), the pseudo-trimming value S11 is set to a zero value to make no output adjustment.

Next, at Step #103, a pseudo-trimming process using the register 111 (writing of the pseudo-trimming value S11 into the register 111) is performed. At this time, the selector 113 is under a condition of selecting the pseudo-trimming value S11 as the trimming value St. Accordingly, in the trimming circuit 102, the output of the main circuit 101 is adjusted based on the pseudo-trimming value S11 read from the register 111. In this manner, it is possible to use the register 111 to render the trimming circuit 102 into a pseudo trimming-after state before performing an actual trimming process using the OTPROM 112.

Next, at Step #104, a pseudo trimming-after measurement of the output OUT is performed. In the pseudo trimming-after measurement, a pseudo trimming-after output value OUT (an adjusted output value OUT which can be obtained based on the trimming value S11) is measured and an error ERR2 between a target value and the output value OUT is determined. The error ERR2 in the pseudo trimming-after measurement results from manufacture tolerance of the trimming circuit 102 (tolerance of capacitors, resistors, switches and so on forming the trimming circuit 102).

Next, at Step #105, the final trimming value S12 is set by correcting the pseudo trimming value S11 with reference to the trimming value correction table TBL2 such that the pseudo trimming-after output value OUT is equal to the target value. In the trimming value correction table TBL2, as shown in the right side of FIG. 4, errors ERR2 between the target value and the output value OUT are uniquely associated with trimming correction values S11a.

If the error ERR2 has a positive value (i.e., the pseudo trimming-after output value OUT is larger than the target value), the trimming correction value S11a is set to lower the pseudo trimming-after output value OUT. For example, if the error ERR2 is +2 steps, the trimming correction value S11a is set to a value (2 down) to lower the pseudo trimming-after output value OUT by 2 steps. On the contrary, if the error ERR2 has a negative value (i.e., the pseudo trimming-after output value OUT is smaller than the target value), the trimming correction value S11a is set to raise the pseudo trimming-after output value OUT. For example, if the error ERR2 is −2 steps, the trimming correction value S11a is set to a value (2 up) to raise the pseudo trimming-after output value OUT by 2 steps. If the error ERR2 has a zero value (i.e., the pseudo trimming-after output value OUT is equal to the target value), the trimming correction value S11a is set to a zero value to make no adjustment to the pseudo-trimming value S11.

The final trimming value S12 is set to a value obtained by adding the trimming correction value S11a to the pseudo-trimming value S11. Accordingly, if the pseudo trimming-after output value OUT is larger than the target value, the final trimming value S12 is set to a value smaller than the pseudo-trimming value S11. On the contrary, if the pseudo trimming-after output value OUT is smaller than the target value, the final trimming value S12 is set to a value larger than the pseudo-trimming value S11. If the pseudo trimming-after output value OUT is equal to the target value, the final trimming value S12 is set to the pseudo-trimming value S11.

In addition, since the pseudo trimming-after error ERR2 is smaller than the trimming-before error ERR1, a bit width N of the trimming value correction table TBL2 is designed to a value (for example, a 4-bit width) sufficiently smaller than the bit width M of the trimming table TBL1. Accordingly, implementing the trimming value correction table TBL2 separately from the trimming table TBL1 will not impose an unnecessary load on memory capacity.

Next, at Step 106, a trimming process using the OTPROM 112 (writing of the final trimming value S12 into the OTPROM 112) is performed. At this time, the selector 113 automatically transitions to a condition of selecting the final trimming value S12 as the trimming value St. Accordingly, the trimming circuit 102 adjusts the output of the main circuit 101 based on the final trimming value S12 read from the OTPROM 112.

Finally, at Step #107, trimming-after measurement of the output value OUT is performed to complete a series of flows.

Figure 5A:
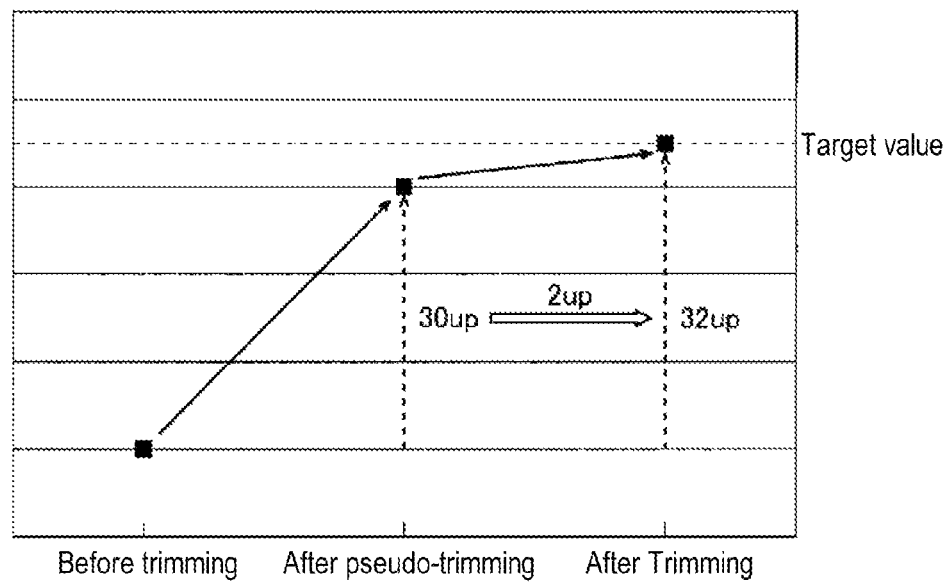
FIG. 5A is a view showing a first example of a trimming result.
Figure 5B:
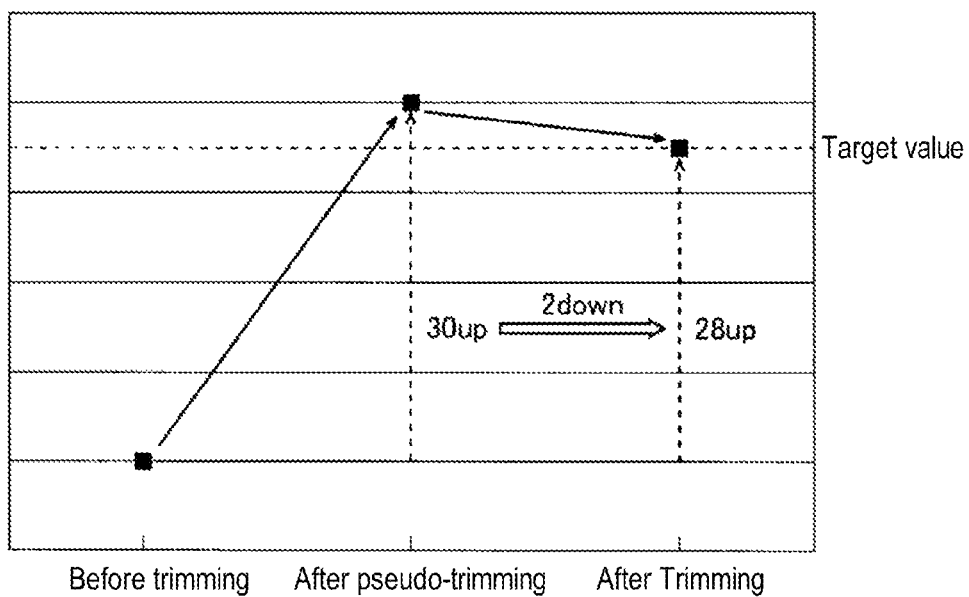
FIG. 5B is a view showing a second example of a trimming result.

FIGS. 5A and 5B are views showing a first and a second example of trimming results, respectively. Both examples have the same trimming-before output value OUT and the pseudo-trimming value S11 is set to a value (30 up) to raise the trimming-before output value OUT by 30 steps by referring to the trimming table TBL1 based on a result of the trimming-before measurement.

If the trimming circuit 102 has no manufacture tolerance, the pseudo trimming-after output value OUT will be equal to the target value. However, in actuality, due to the manufacture tolerance of the trimming circuit 102, the pseudo trimming-after output value OUT is smaller by two steps than the target value in the first example of FIG. 5A, whereas the pseudo trimming-after output value OUT is larger by two steps than the target value in the second example of FIG. 5B.

As a result of the reference to the trimming value correction table TBL2 based on the result of the pseudo trimming-after measurement, since the trimming correction value S11a is set to a value (2 up) to raise the pseudo trimming-after output value OUT by 2 steps in the first example of FIG. 5A, the final trimming value S12 is set to a value (32 up) to raise the trimming-before output value OUT by 32 steps. On the other hand, since the trimming correction value S11a is set to a value (2 down) to lower the pseudo trimming-after output value OUT by 2 steps in the second example of FIG. 5B, the final trimming value S12 is set to a value (28 up) to raise the trimming-before output value OUT by 28 steps.

Figure 6:
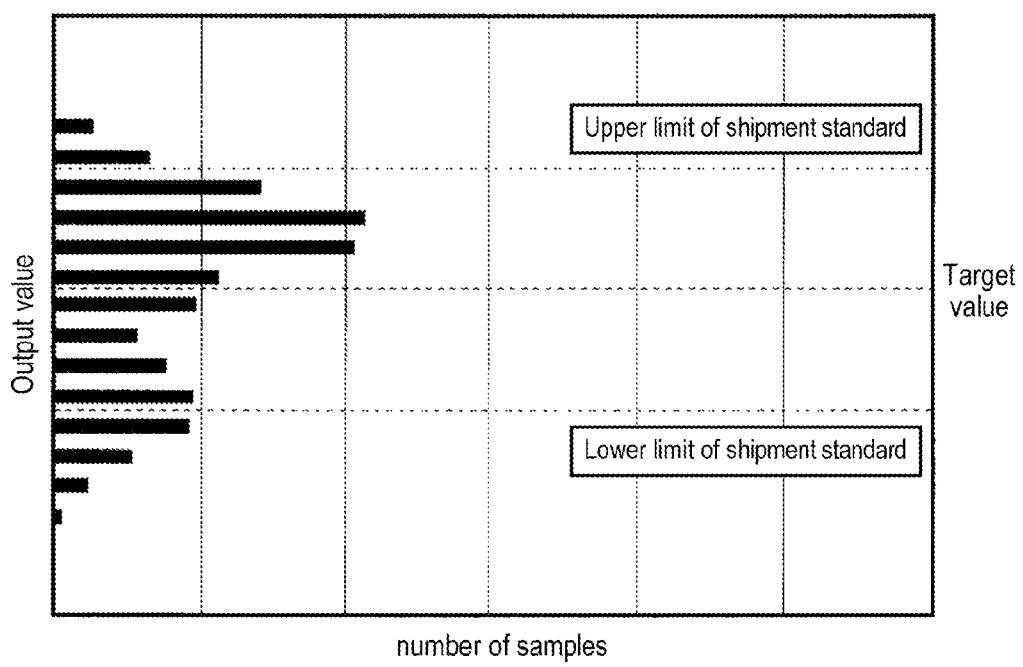
FIG. 6 is a histogram showing a distribution of trimming-before output values.
Figure 7:
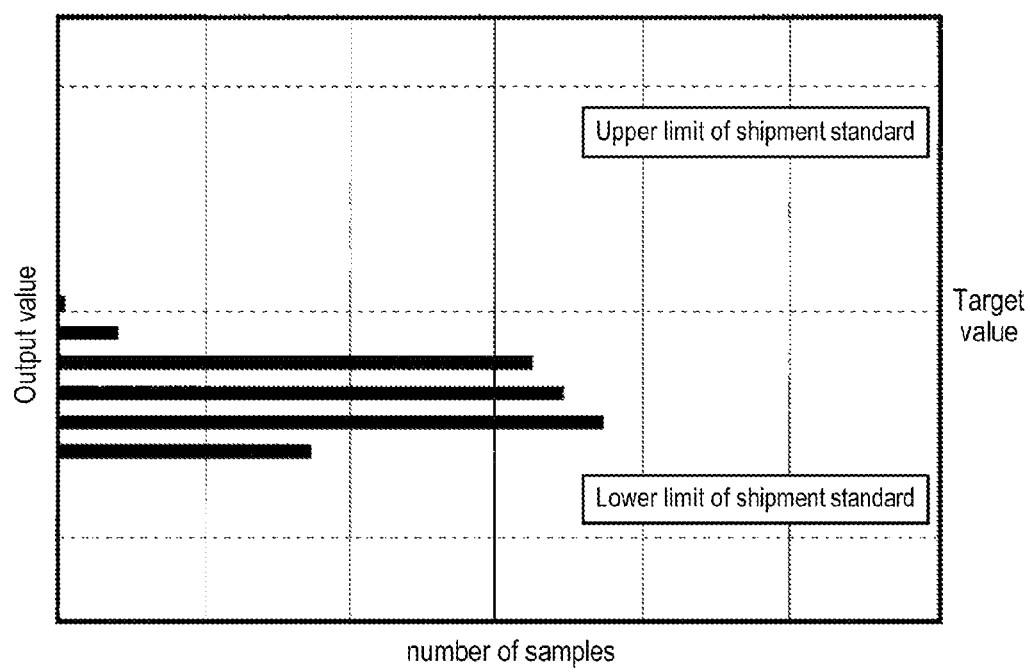
FIG. 7 is a histogram showing a distribution of pseudo-trimming-after output values.
Figure 8:
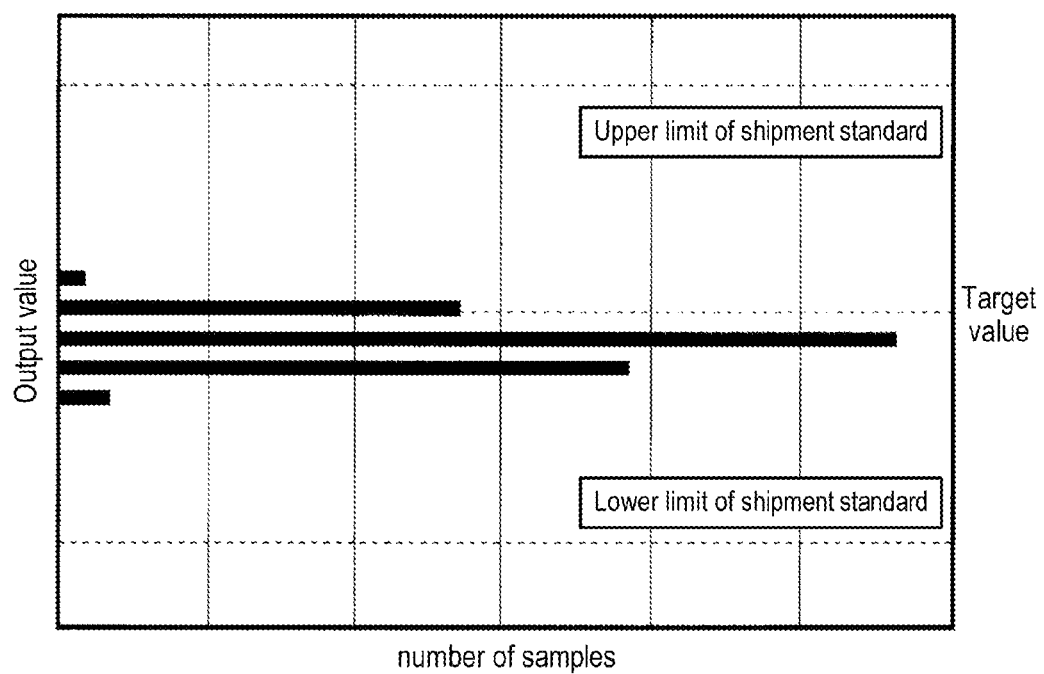
FIG. 8 is a histogram showing a distribution of trimming-after output values.

FIGS. 6, 7 and 8 are histograms showing distributions of trimming-before, pseudo-trimming-after and trimming-after output values, respectively. The trimming-before histogram (see FIG. 6) has samples whose output values OUT do not satisfy the upper or the lower limit of the shipment standard, whereas all samples satisfy the shipment standard in the pseudo trimming-after histogram (see FIG. 7). In addition, it can be seen from the final trimming-after histogram (see FIG. 8) that the output values OUT converge to be closer to the target value (the median value of the shipment standard) than those shown in the pseudo trimming-after histogram (see FIG. 7), thereby achieving further improvement of the trimming precision. In this manner, the improved trimming precision can result in stabilization of the output values OUT and hence productivity.

<Trimming Value Setting Circuit> (Second Example Configuration)

Figure 9:
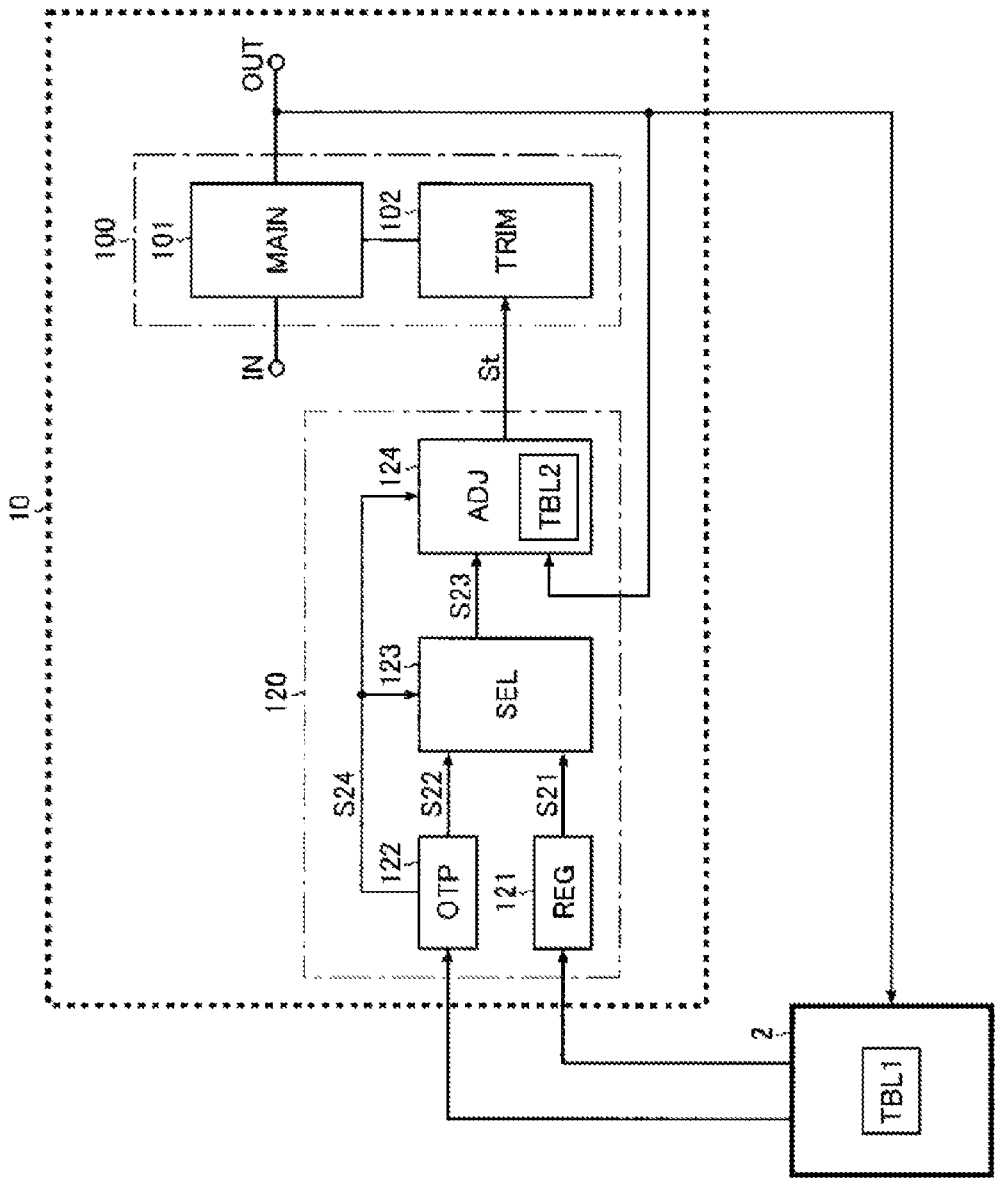
FIG. 9 is a block diagram showing a second example configuration of the trimming value setting circuit.

FIG. 9 is a block diagram showing a second example configuration of the trimming value setting circuit. A trimming value setting circuit 120 of the second example configuration includes a register (REG) 121, an OTPROM (OTP) 122, a selector (SEL) 123 and a trimming value correcting part (ADJ) 124.

The register 121 stores an initial trimming value S21 in a volatile manner. The initial trimming value S21 may be an initial value read from the register 121 or any value written from the tester 2.

The OTPROM 122 is a trimming value storage for storing a correction-before trimming value S22 in a non-volatile manner. The correction-before trimming value S22 is set with reference to the trimming table TBL1 such that the output value OUT of the trimming object circuit 100, which is obtained based on the initial trimming value S21, becomes equal to a target value. The trimming table TBL1 is implemented with software installed in the tester 2 and the correction-before trimming value S22 is set by the tester 2.

The selector 123 selects one of the initial trimming value S21 and the correction-before trimming value S22, as a select trimming value S23. The selector 123 switches a signal path based on a switching signal S24 read from the OTPROM 122. If the OTPROM 122 is unwritten, the switching signal S24 has a value (initial value) to instruct a signal path switching to the register 121, while the switching signal S24 read from the written OTPROM 122 has a value to instruct a signal path switching to the OTPROM 122. This configuration allows the signal path of the selector 123 to automatically switch from the register 121 to the OTPROM 122 after performing the trimming process (the writing of data into the OTPROM 122).

The trimming value correcting part 124 performs correction on the correction-before trimming value S22 (i.e., the select trimming value S23) with reference to the trimming value correction table TBL2 such that the output value OUT of the trimming object circuit 100, which is obtained based on the correction-before trimming value S22, is equal to a target value, and then outputs the corrected trimming value S22 as a final trimming value St. In addition, the trimming value correcting part 124 switches between a turn-on and a turn-off state based on the switching signal S24 read from the OTPROM 122. If the OTPROM 122 is unwritten, the switching signal S24 has a value (initial value) to instruct to turn-off the trimming value correcting part 124, while the switching signal S24 read from the written OTPROM 122 has a value to instruct to turn-on the trimming value correcting part 124. This configuration allows the trimming value correcting part 124 to be automatically turned on after performing the trimming process (the writing of data into the OTPROM 122).

In this manner, in the trimming value setting circuit 120 of the second example configuration, the trimming value correction table TBL2 is implemented with hardware in the liquid crystal driver 10 and the setting of the trimming value St (the correction of the correction-before trimming value S22) is performed by the liquid crystal driver 10.

Figure 10:
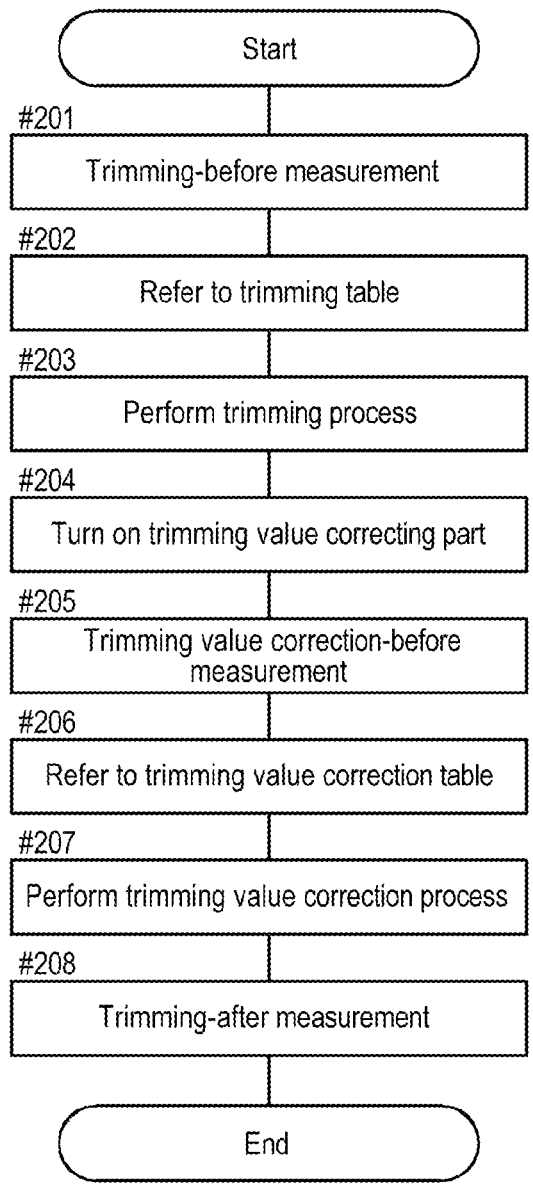
FIG. 10 is a flow chart showing a second trimming process.

FIG. 10 is a flow chart showing a second trimming process. While the tester 2 is basically responsible for performing the steps in this embodiment, the liquid crystal driver 10 (or the trimming value correcting part 124) is responsible for a correcting process for the correction-before trimming value S22 (including Steps 205 to 207 which will be described later).

At start of the flow chart, trimming-before measurement of the output value OUT is first carried out by the tester 2 at Step #201. In the trimming-before measurement, the trimming-before (i.e., unadjusted) output value OUT is measured and an error ERR1 between a target value and the output value OUT is determined.

Next, at Step #202, the correction-before trimming value S22 is set with reference to the trimming table TBL1 such that the trimming-before output value OUT becomes equal to the target value. The setting operation for the correction-before trimming value S22 is the same as the setting operation for the pseudo-trimming value S11 described earlier with reference to the first example configuration and therefore, explanation of which will not be repeated.

Next, at Step #203, a trimming process using the OTPROM 112 (writing of the correction-before trimming value S22 into the OTPROM 112) is performed by the tester 2. At this time, the selector 123 automatically transitions to a condition of selecting the correction-before trimming value S22 as the select trimming value S23. Accordingly, the trimming circuit 102 adjusts the output of the main circuit 101 based on the correction-before trimming value S22 read from the OTPROM 112.

Next, at Step #204, the trimming value correcting part 124 is automatically turned on according to the switching signal S24 read from the written OTPROM 122.

Next, at Step #205, trimming-value-before-correction measurement of the output OUT is performed by the trimming value correcting part 124. In the trimming-value-before-correction measurement, a trimming-after output value OUT (an adjusted output value OUT which can be obtained based on the correction-before trimming value S22) is measured and an error ERR2 between a target value and the output value OUT is determined. The error ERR2 in the trimming-value-correction-before measurement results from manufacture tolerance of the trimming circuit 102.

Next, at Step #206, a trimming correction value is set by the trimming value correcting part 124 with reference to the trimming value correction table TBL2 such that the trimming-after output value OUT becomes equal to the target value. The setting operation for the trimming correction value is the same as the setting operation for the trimming correction value S11a described earlier with reference to the first example configuration and therefore, explanation of which will not be repeated.

Next, at Step #207, a trimming value St, which is obtained by making correction on the correction-before trimming value S22 to add the trimming correction value to the correction-before trimming value S22, is set by the trimming value correcting part 124. Accordingly, the trimming circuit 102 adjusts the output of the main circuit 101 based on the set trimming value St.

Finally, at Step #208, trimming-after measurement of the output value OUT is performed by the tester 2 to complete a series of flows. At this time, from the standpoint of the tester 2, the trimming process is merely performed with reference to the trimming table TBL1 alone but it appears that a highly precise trimming result is obtained without depending on a manufacture tolerance of the trimming circuit 102.

<Trimming Value Setting Circuit> (Third Example Configuration)

Figure 11:
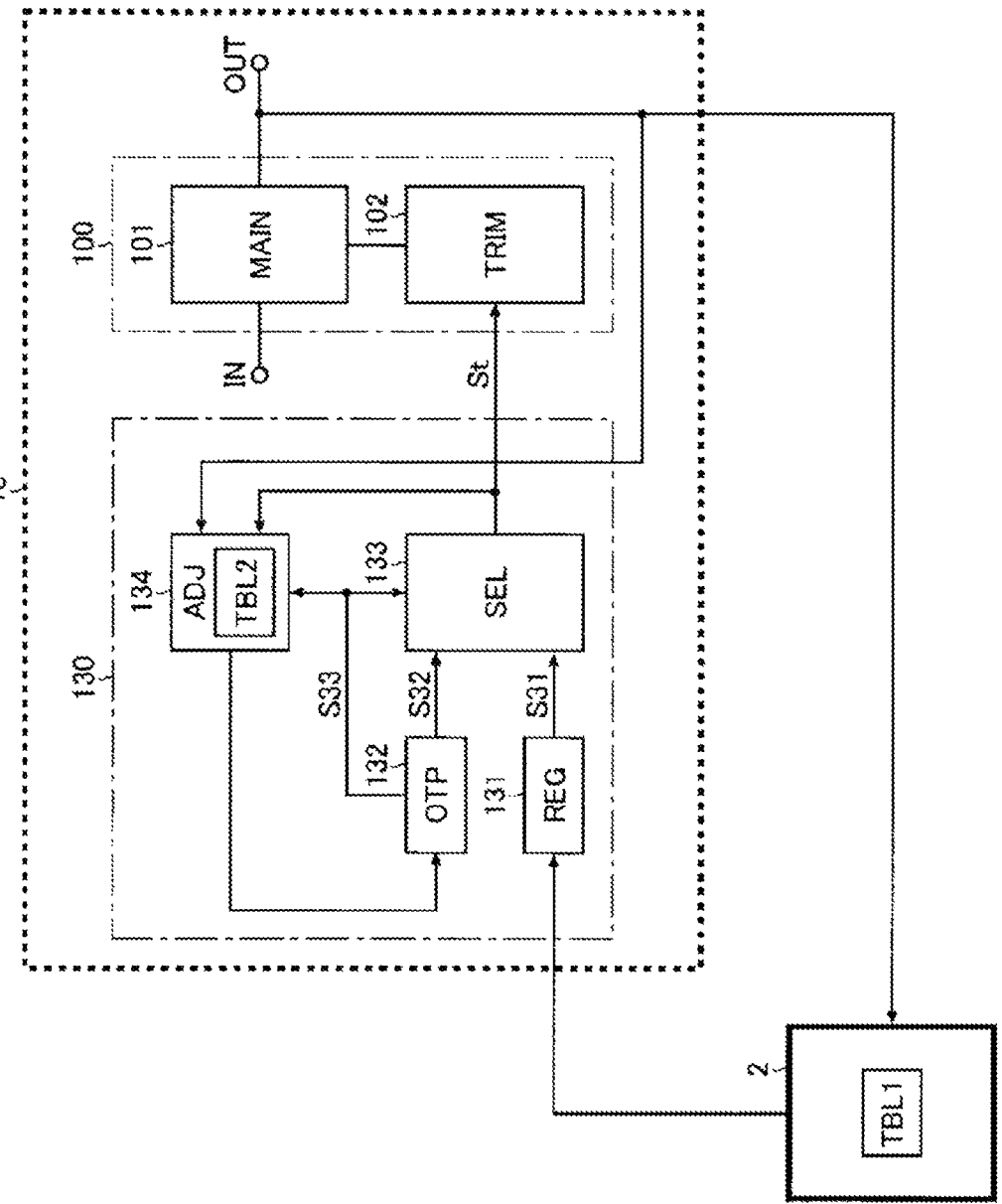
FIG. 11 is a block diagram showing a third example configuration of the trimming value setting circuit.

FIG. 11 is a block diagram showing a third example configuration of the trimming value setting circuit. A trimming value setting circuit 130 of the third example configuration includes a register (REG) 131, an OTPROM (OTP) 132, a selector (SEL) 133 and a trimming value correcting part (ADJ) 134.

The register 131 stores a pseudo-trimming value S31 in a volatile manner. The pseudo-trimming value S31 is set with reference to the trimming table TBL1 such that the output value OUT of the trimming object circuit 100 becomes equal to a target value at the time of trimming process which will be described later. The trimming table TBL1 is implemented with software installed in the tester 2 and the setting of the pseudo-trimming value S31 is performed by the tester 2.

The OTPROM 132 is a trimming value storage for storing a final trimming value S32 in a non-volatile manner. The final trimming value S32 is set by correcting the pseudo-trimming value S31 with reference to the trimming value correction table TBL2 such that the output value OUT of the trimming object circuit 100, which is obtained based on the pseudo-trimming value S31, becomes equal to a target value at the time of trimming process which will be described later.

The selector 133 selects one of the pseudo-trimming value S31 and the final trimming value S32, as the trimming value St. In addition, the selector 133 switches a signal path based on a switching signal S33 read from the OTPROM 132. If the OTPROM 132 is unwritten, the switching signal S33 has a value (initial value) to instruct a signal path switching to the register 131, while the switching signal S33 read from the written OTPROM 132 has a value to instruct a signal path switching to the OTPROM 132. This configuration allows the signal path of the selector 133 to automatically switch from the register 131 to the OTPROM 132 after performing the trimming process (the writing of data into the OTPROM 132).

The trimming value correcting part 134 performs correction on the pseudo-trimming value S31 with reference to the trimming value correction table TBL2 such that the output value OUT of the trimming object circuit 100, which is obtained based on the pseudo-trimming value S31, is equal to a target value, and then sets the final trimming value S32 which is then written in the OTPTOM 132. In addition, the trimming value correcting part 134 switches between a turn-on and a turn-off state based on the switching signal S33 read from the OTPROM 132. If the OTPROM 132 is unwritten, the switching signal S33 has a value (initial value) to instruct to turn-on the trimming value correcting part 134, while the switching signal S33 read from the written OTPROM 132 has a value to instruct to turn-off the trimming value correcting part 134. This configuration allows the trimming value correcting part 124 to be automatically turned off after performing the trimming process (the writing of data into the OTPROM 132).

In this manner, like the second example configuration, in the trimming value setting circuit 130 of the third example configuration, the trimming value correction table TBL2 is implemented with hardware in the liquid crystal driver 10 and the setting of the final trimming value S32 (the correction of the pseudo-trimming value S31) is performed by the liquid crystal driver 10.

Figure 12:
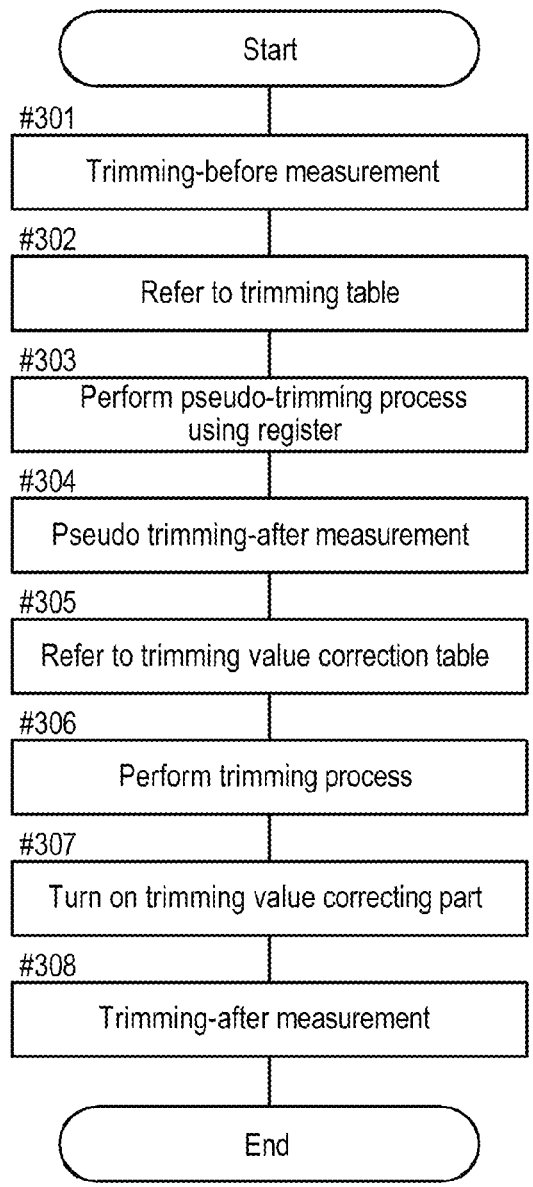
FIG. 12 is a flow chart showing a third trimming process.

FIG. 12 is a flow chart showing a third trimming process. While the tester 2 is basically responsible for performing steps in this embodiment, the liquid crystal driver 10 (or the trimming value correcting part 134) is responsible for a correcting process for the pseudo-trimming value S31 and a writing process of the final trimming value S32 (including Steps 304 to 306 which will be described later).

At start of the flow chart, trimming-before measurement of the output value OUT is first carried out by the tester 2 at Step #301. In the trimming-before measurement, the trimming-before (i.e., unadjusted) output value OUT is measured and an error ERR1 between a target value and the output value OUT is determined.

Next, at Step #302, the pseudo-trimming value S31 is set by the tester 2 with reference to the trimming table TBL1 such that the trimming-before output value OUT becomes equal to the target value. The setting operation for the pseudo-trimming value S31 is the same as the setting operation for the pseudo-trimming value S11 described earlier with reference to the first example configuration and therefore, explanation of which will not be repeated.

Next, at Step #303, a pseudo-trimming process using the register 131 (writing of the pseudo-trimming value S31 into the register 131) is performed by the tester 2. At this time, the selector 133 is under a condition of selecting the pseudo-trimming value S31 as the trimming value St. Accordingly, the trimming circuit 102 adjusts the output of the main circuit 101 based on the pseudo-trimming value S31 read from the register 131. In this manner, it is possible to use the register 131 to render the trimming circuit 102 into a pseudo trimming-after state before performing an actual trimming process using the OTPROM 132.

If a user performs any trimming process (including a narrow-sense trimming process aimed at correction on variations of the output value as well as a wide-sense trimming process aimed at any setting of the output value) arbitrarily for the liquid crystal driver 10 shipped under a condition where the trimming object circuit 100 is partially or entirely untrimmed, a trimming value that the user desires to write into the OTPROM 132 is written into the register 131 as the pseudo-trimming value S31 instead of being directly written into the OTPROM 132.

Next, at Step #304, pseudo trimming-after measurement of the output OUT is performed by the trimming value correcting part 134. In the pseudo trimming-after measurement, a pseudo trimming-after output value OUT (an adjusted output value OUT which can be obtained based on the pseudo-trimming value S31) is measured and an error ERR2 between a target value and the output value OUT is determined. The error ERR2 in the pseudo trimming-after measurement results from manufacture tolerance of the trimming circuit 102. In addition, the trimming value correcting part 134 starts the pseudo trimming-after measurement after recognizing that the pseudo-trimming value S31 is written from the tester 2 into the register 131.

Next, at Step #305, the final trimming value S32 is set by the trimming value correcting part 134 by correcting the pseudo-trimming value S31 with reference to the trimming value correction table TBL2 such that the pseudo trimming-after output value OUT becomes equal to the target value. The setting operation for the final trimming value S32 (the correcting operation of the pseudo-trimming value S31) is the same as the setting operation for the final trimming value S11 (the correcting operation of the pseudo-trimming value S11) described earlier with reference to the first example configuration and therefore, explanation of which will not be repeated.

Next, at Step #306, a trimming process using the OTPROM 132 (writing of the final trimming value S32 into the OTPROM 132) is performed by the trimming value correcting part 134. At this time, the selector 133 automatically transitions to a condition of selecting the final trimming value S32 as the trimming value St. Accordingly, the trimming circuit 102 adjusts the output of the main circuit 101 based on the final trimming value S32 read from the OTPROM 132.

Next, at Step #307, the trimming value correcting part 134 is automatically turned off based on the switching signal S33 read from the written OTPROM 132.

Finally, at Step #308, trimming-after measurement of the output value OUT is performed by the tester 2 to complete a series of flows. At this time, from the standpoint of the tester 2, the trimming process is merely performed with reference to the trimming table TBL1 alone and it appears that a highly precise trimming result is obtained without depending on manufacture tolerance of the trimming circuit 102. In addition, even when a user performs the trimming process, it is possible to achieve a highly-precise trimming without changing the trimming process by the user.

<Application to Electronic Apparatuses>
[Television]

Figure 13:
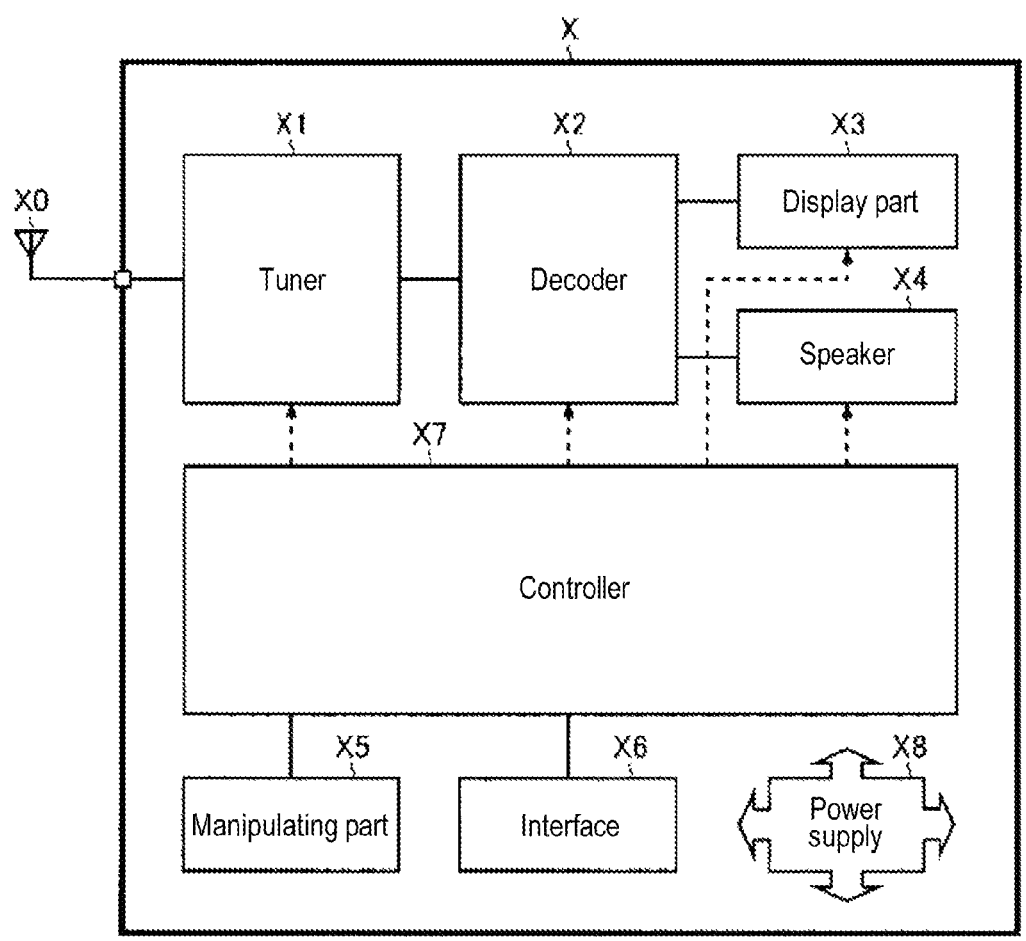
FIG. 13 is a block diagram showing an example configuration of a television equipped with a liquid crystal display.
Figure 14A:
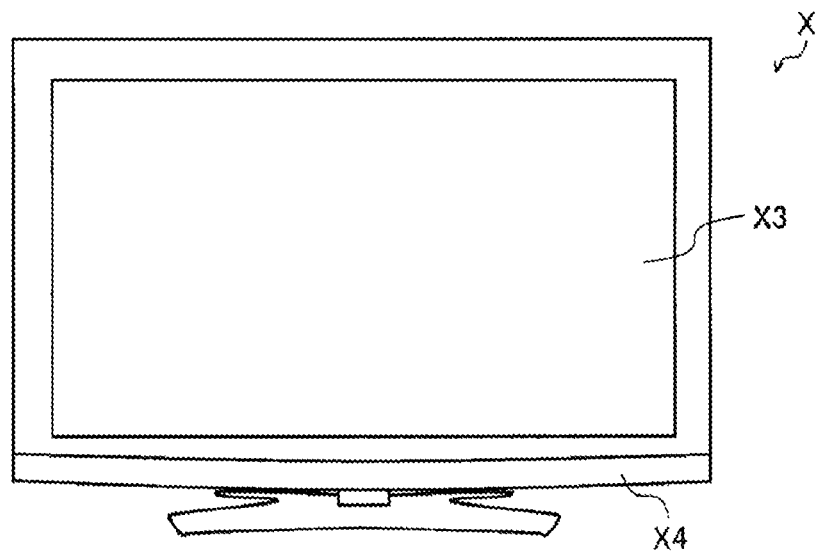
FIG. 14A is a front view of the television equipped with the liquid crystal display.
Figure 14B:
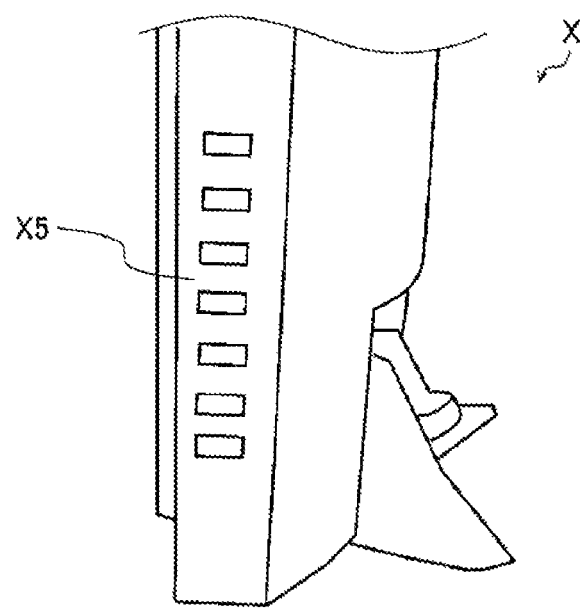
FIG. 14B is a side view of the television equipped with the liquid crystal display.
Figure 14C:
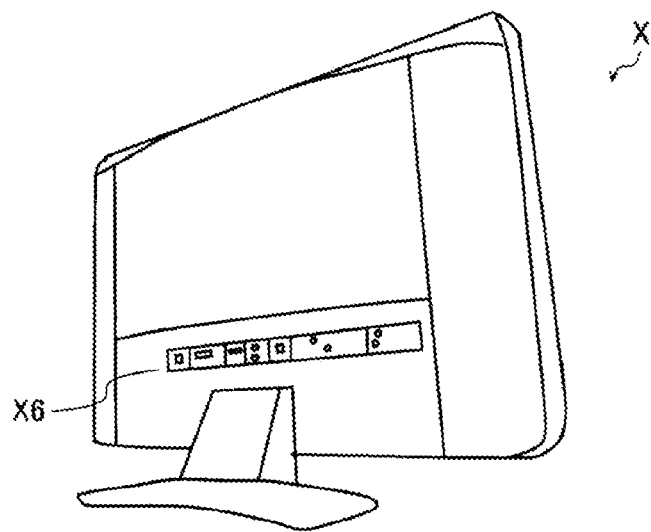
FIG. 14C is a rear view of the television equipped with the liquid crystal display.

FIG. 13 is a block diagram showing a configuration of a television equipped with a liquid crystal display. FIGS. 14A to 14C are a front view, a side view and a rear view of the television equipped with the liquid crystal display, respectively. The television X of this configuration includes a tuner X1, a decoder X2, a display part X3, a speaker X4, a manipulating part X5, an interface X6, a controller X7 and a power supply X8.

The tuner X1 selects a broadcasting signal of a desired channel from signals received from an external antenna X0 connected to the television X.

The decoder X2 generates a video signal and a voice signal from the broadcasting signal selected by the tuner X1. In addition, the decoder X2 has also a function of generating a video signal and a voice signal based on an external signal input from the interface X6.

The display part X3 displays a video according to the video signal generated by the decoder X2. The above-described liquid crystal display 1 can be suitable to be used for the display part X3.

The speaker X4 outputs a voice according to the voice signal generated by the decoder X2.

The manipulating part X5 is one of human interfaces receiving a user's manipulation and may employ buttons, switches, a remote controller and so on.

The interface X6 is a front end receiving an external input signal from an external device (such as an optical disk player, a hard disk drive or the like).

The controller X7 controls the entire operation of the above components X1 to X6. The controller X7 may employ a CPU (Central Processing Unit) or other controllers.

The power supply X8 supplies electric power to the above components X1 to X7.

[Mobile Phone]

Figure 15:
FIG. 15 is a view showing an external appearance of a smart phone.

FIG. 15 is a view showing an external appearance of a mobile phone (smart phone) equipped with a liquid crystal display. The mobile phone Y of this example configuration includes an imaging part Y1 mounted on the front and/or the rear side of a body of the mobile phone Y, a manipulating part Y2 (various buttons and so on) receiving a user's operation, and a display part Y3 displaying characters and videos (including pick-up images). The above-described liquid crystal display 1 can be suitable to be used for the display part Y3. The display part Y3 is equipped with a touch panel function receiving a user's touch manipulation. The mobile phone Y equipped with the liquid crystal display 1 is not limited to a smart phone but may include a so-called basic phone, a feature phone and the like.

[Information Terminal]

Figure 16:
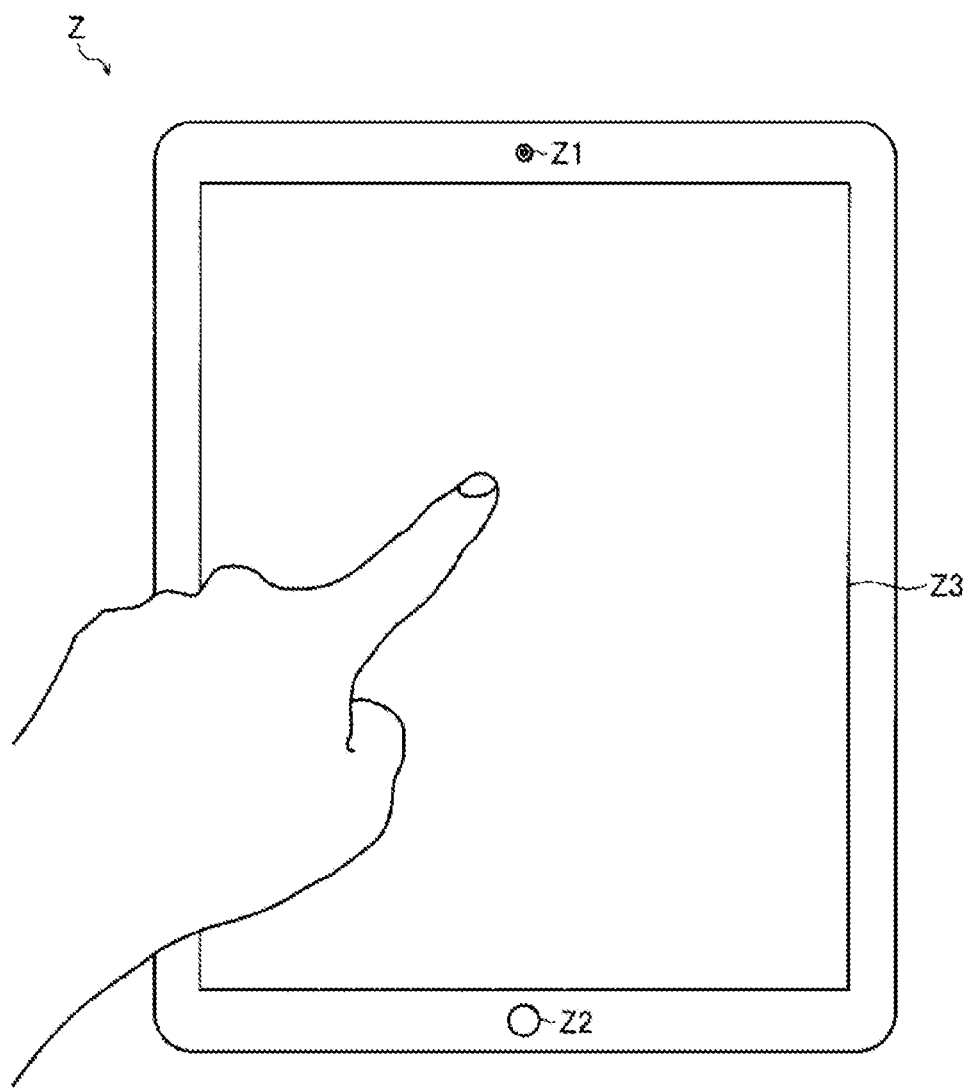
FIG. 16 is a view showing an external appearance of a tablet PC.
Figure 17:
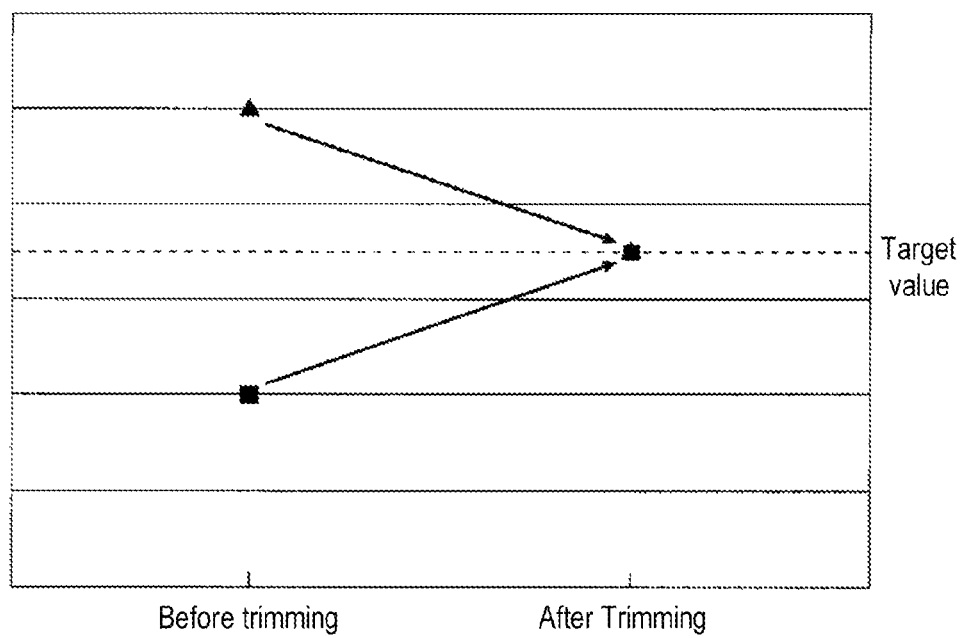
FIG. 17 is a view showing an ideal trimming result.
Figure 18:
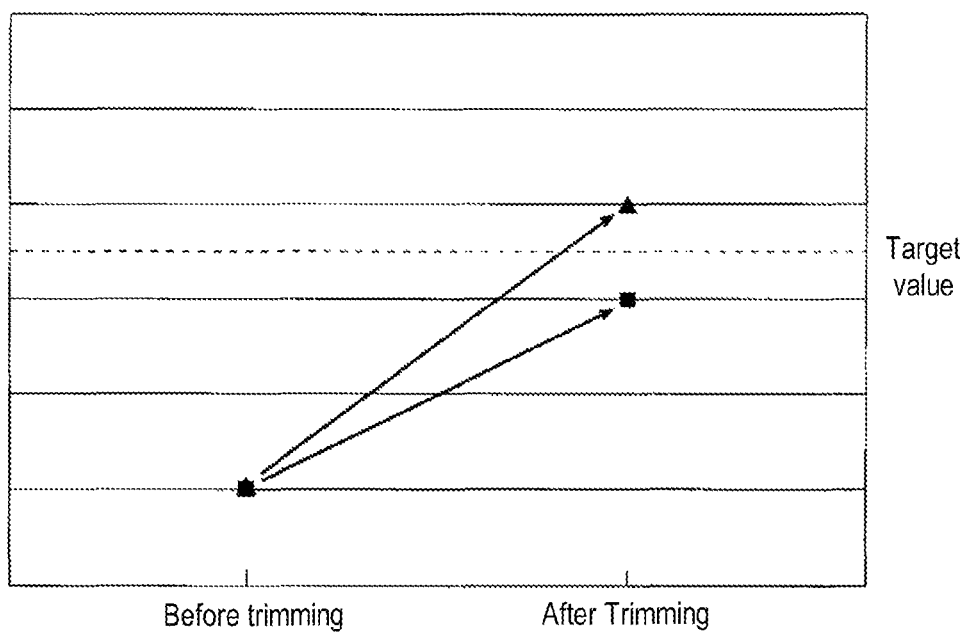
FIG. 18 is a view showing a non-uniform trimming-after output.

FIG. 16 is a view showing an external appearance of an information terminal (tablet PC) equipped with a liquid crystal display. The information terminal Z of this example configuration includes an imaging part Z1 mounted on the front and/or the rear side of a body of the information terminal Z, a manipulating part Z2 (various buttons and so on) receiving a user's manipulation, and a display part Z3 displaying characters and videos (including pick-up images). The above-described liquid crystal display 1 can be suitable to be used for the display part Z3. The display part Z3 is equipped with a touch panel function receiving a user's touch manipulation. The information terminal Z equipped with the liquid crystal display 1 is not limited to a tablet PC but may include a notebook PC, a portable game machine and the like.

<Other Modifications>

While applications of the present disclosure to a liquid crystal driver driving a liquid crystal display panel have been illustrated in the above embodiments, without being limited thereto, the present disclosure can be widely applied to the general semiconductor devices equipped with a trimming circuit.

In addition, while a trimming process using a data-once-writable OTPROM has been illustrated in the above embodiments, without being limited thereto, the present disclosure may employ any suitable trimming methods including a Zener-zap trimming process to destroy a trimming element with a high voltage, a polysilicon fuse trimming process to burn off a trimming element with a large current, a laser cut trimming process to burn off a trimming element with a laser, etc.

INDUSTRIAL APPLICABILITY

The present disclosure can be used as technologies for realizing a high precision of a liquid crystal driver to drive a liquid crystal display panel, for example.

According to the present disclosure in some embodiments, it is possible to provide a semiconductor device with an improved trimming precision, and a liquid crystal display and an electronic apparatus using the same.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a trimming object circuit configured to use a trimming circuit to adjust an output based on a trimming value; and
   a trimming value setting circuit configured to set the trimming value, the trimming value setting circuit including:
      a register configured to volatilely store a pseudo-trimming value set with reference to a trimming table such that an output value of the trimming object circuit becomes equal to a target value;
      a trimming value storage configured to non-volatilely store a final trimming value with a predetermined trimming process, wherein the final trimming value is set by correcting the pseudo-trimming value with reference to a trimming value correction table such that the output value of the trimming object circuit, which is obtained based on the pseudo-trimming value, becomes equal to the target value; and
      a selector configured to select one of the pseudo-trimming value and the final trimming value as the trimming value.

2. The semiconductor device of claim 1, wherein the selector switches a signal path based on an output of the trimming value storage.

3. The semiconductor device of claim 1, wherein a bit width of the trimming value correction table is smaller than a bit width of the trimming table.

4. The semiconductor device of claim 1, wherein the trimming process is one selected from a group consisting of a Zener-zap trimming process, a polysilicon fuse trimming process, a laser cut trimming process and an OTPROM (One-Time Programmable Read Only Memory) trimming process.

5. The semiconductor device of claim 1, further comprising:
   a logic part configured to latch and output a digital signal in synchronization with a clock signal;
   an oscillator configured to generate the clock signal;
   a shift register configured to level-shift the digital signal;
   a grayscale voltage generator configured to generate a plurality of grayscale voltages from a reference voltage;
   a digital/analog converter (DAC) configured to use the grayscale voltages to generate an analog signal from the digital signal; and
   an amplifier configured to amplify the analog signal to generate an output signal to liquid crystal pixels forming a liquid crystal display panel,
   wherein either the oscillator or the grayscale voltage generator corresponds to the trimming object circuit.

6. A liquid crystal display comprising:
   a liquid crystal display panel including liquid crystal pixels; and
   a semiconductor device of claim 5, which is configured to generate an output signal to the liquid crystal pixels.

7. An electronic apparatus comprising a liquid crystal display of claim 6.

8. The electronic apparatus of claim 7, wherein the electronic apparatus is one selected from a group consisting of a television, a mobile phone and an information terminal.

9. A semiconductor device comprising:
- a trimming object circuit configured to use a trimming circuit to adjust an output based on a trimming value; and
- a trimming value setting circuit configured to set the trimming value, the trimming value setting circuit including:
  - a register configured to volatilely store an initial trimming value;
  - a trimming value storage configured to non-volatilely store a correction-before trimming value with a predetermined trimming process, wherein the correction-before trimming value is set with reference to a trimming table such that an output value of the trimming object circuit, which is obtained based on the initial trimming value, becomes equal to a target value;
  - a selector configured to select one of the initial trimming value and the correction-before trimming value; and
  - a trimming value correcting part configured to correct the correction-before trimming value with reference to a trimming value correction table such that the output value of the trimming object circuit, which is obtained based on the correction-before trimming value, becomes equal to the target value, and output the corrected trimming value as the trimming value.

10. The semiconductor device of claim 9, wherein the trimming value correcting part switches between a turn-on and a turn-off state based on an output of the trimming value storage.

11. The semiconductor device of claim 9, wherein the selector switches a signal path based on an output of the trimming value storage.

12. The semiconductor device of claim 9, wherein a bit width of the trimming value correction table is smaller than a bit width of the trimming table.

13. The semiconductor device of claim 9, wherein the trimming process is one selected from a group consisting of a Zener-zap trimming process, a polysilicon fuse trimming process, a laser cut trimming process and an OTPROM (One-Time Programmable Read Only Memory) trimming process.

14. The semiconductor device of claim 9, further comprising:
- a logic part configured to latch and output a digital signal in synchronization with a clock signal;
- an oscillator configured to generate the clock signal;
- a shift register configured to level-shift the digital signal;
- a grayscale voltage generator configured to generate a plurality of grayscale voltages from a reference voltage;
- a digital/analog converter (DAC) configured to use the grayscale voltages to generate an analog signal from the digital signal; and
- an amplifier configured to amplify the analog signal to generate an output signal to liquid crystal pixels forming a liquid crystal display panel,
- wherein either the oscillator or the grayscale voltage generator corresponds to the trimming object circuit.

15. A semiconductor device comprising:
- a trimming object circuit configured to use a trimming circuit to adjust an output based on a trimming value; and
- a trimming value setting circuit configured to set the trimming value, the trimming value setting circuit including:
  - a register configured to volatilely store a pseudo-trimming value set with reference to a trimming table such that an output value of the trimming object circuit becomes equal to a target value;
  - a trimming value storage configured to non-volatilely store a final trimming value with a predetermined trimming process;
  - a selector configured to select one of the pseudo-trimming value and the final trimming value; and
  - a trimming value correcting part configured to correct the pseudo-trimming value with reference to a trimming value correction table such that the output value of the trimming object circuit, which is obtained based on the pseudo-trimming value, becomes equal to the target value, and set the final trimming value.

16. The semiconductor device of claim 15, wherein the trimming value correcting part switches between a turn-on and a turn-off state based on an output of the trimming value storage.

17. The semiconductor device of claim 15, wherein the selector switches a signal path based on an output of the trimming value storage.

18. The semiconductor device of claim 15, wherein a bit width of the trimming value correction table is smaller than a bit width of the trimming table.

19. The semiconductor device of claim 15, wherein the trimming process is one selected from a group consisting of a Zener-zap trimming process, a polysilicon fuse trimming process, a laser cut trimming process and an OTPROM (One-Time Programmable Read Only Memory) trimming process.

20. The semiconductor device of claim 15, further comprising:
- a logic part configured to latch and output a digital signal in synchronization with a clock signal;
- an oscillator configured to generate the clock signal;
- a shift register configured to level-shift the digital signal;
- a grayscale voltage generator configured to generate a plurality of grayscale voltages from a reference voltage;
- a digital/analog converter (DAC) configured to use the grayscale voltages to generate an analog signal from the digital signal; and
- an amplifier configured to amplify the analog signal to generate an output signal to liquid crystal pixels forming a liquid crystal display panel,
- wherein either the oscillator or the grayscale voltage generator corresponds to the trimming object circuit.

* * * * *